United States Patent
Lee et al.

(10) Patent No.: US 11,309,501 B2
(45) Date of Patent: Apr. 19, 2022

(54) FLEXIBLE DISPLAY DEVICE

(71) Applicant: Samsung Display Co., Ltd., Yongin-si (KR)

(72) Inventors: Kyoungah Lee, Seoul (KR); MinGu Kim, Seoul (KR); Hyunsuk Nam, Seoul (KR); Hyoyul Yoon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 16/703,711

(22) Filed: Dec. 4, 2019

(65) Prior Publication Data
US 2020/0274085 A1    Aug. 27, 2020

(30) Foreign Application Priority Data
Feb. 22, 2019    (KR) .......................... 10-2019-0020996

(51) Int. Cl.
| H01L 51/00 | (2006.01) |
| H01L 27/32 | (2006.01) |
| B32B 7/12 | (2006.01) |
| B32B 3/26 | (2006.01) |

(52) U.S. Cl.
CPC .......... *H01L 51/0097* (2013.01); *B32B 3/263* (2013.01); *B32B 7/12* (2013.01); *H01L 27/32* (2013.01); *B32B 2307/546* (2013.01); *B32B 2457/206* (2013.01)

(58) Field of Classification Search
CPC ..... H01L 51/0097; H01L 27/32; B32B 3/263; B32B 7/12
USPC .......................................................... 428/172
See application file for complete search history.

(56) References Cited

U.S. PATENT DOCUMENTS

| 10,268,242 | B2 | 4/2019 | Seo et al. |
| 2016/0282661 | A1 | 9/2016 | Nam |
| 2016/0338219 | A1* | 11/2016 | Seo ........................ G06F 1/1652 |
| 2017/0123461 | A1* | 5/2017 | Kim ......................... H05K 5/03 |
| 2018/0088392 | A1* | 3/2018 | Park .................... H01L 51/0097 |
| 2019/0014669 | A1* | 1/2019 | Ahn ........................ G06F 1/1626 |
| 2019/0061318 | A1* | 2/2019 | Jung ......................... G06F 3/041 |
| 2019/0181364 | A1* | 6/2019 | Jeong .................. H01L 27/3244 |

FOREIGN PATENT DOCUMENTS

| KR | 10-2016-0116122 A | 10/2016 |
| KR | 10-2016-0133053 A | 11/2016 |
| KR | 10-2017-0093610 A | 8/2017 |

* cited by examiner

*Primary Examiner* — Tahseen Khan
(74) *Attorney, Agent, or Firm* — Lewis Roca Rothgerber Christie LLP

(57) ABSTRACT

A flexible display device includes a display panel including a bending area, a first non-bending area, and a second non-bending area, an outer member over a first surface of the display panel, and a stress control member between the display panel and the outer member, and including a first control area overlapping with the bending area, and a second control area and a third control area overlapping with the first non-bending area and the second non-bending area, respectively, such that the first control area is between the second control area and the third control area, and a maximum thickness of the first control area is less than a thickness of an end of the second control area and a thickness of an end of the third control area spaced apart from a bending axis in the second direction.

20 Claims, 11 Drawing Sheets

FLEXIBLE DISPLAY DEVICE

CROSS-REFERENCE TO RELATED APPLICATION

This application claims priority to and the benefit of Korean Patent Application No. 10-2019-0020996, filed on Feb. 22, 2019 in the Korean Intellectual Property Office, the entire content of which is hereby incorporated by reference.

BACKGROUND

1. Field

Aspects of embodiments of the inventive concept described herein relate to a flexible display device.

2. Description of the Related Art

Recently, a display device (herein, referred to as a flexible display device), which is able to be bent, curved, or folded, has been developed. Such a flexible display device includes an adhesive member to bond a flexible display panel, various outer members, and components to each other.

The outer members may have mutually different functions, respectively. The outer members are disposed on at least one of a surface and an opposite surface of the flexible display panel while interposing the adhesive member therebetween. The outer members are curved or bent together with the flexible display panel.

SUMMARY

According to an aspect of embodiments of the inventive concept, in a flexible display device, components may be prevented from being delaminated from each other due to bending, by making the thickness of an adhesive member in a bending area less than the thickness of an adhesive member in a non-bending area. According to another aspect of embodiments of the present disclosure, a flexible display device may have a reduced incident of failure.

According to one or more embodiments, a flexible display device includes a display panel including a bending area bendable about a bending axis extending in a first direction, and a first non-bending area and a second non-bending area spaced apart from each other in a second direction crossing the first direction with the bending area between the first non-bending area and the second non-bending area, an outer member over a first surface of the display panel, and a stress control member between the display panel and the outer member, and including a first control area overlapping with the bending area and a second control area and a third control area overlapping with the first non-bending area and the second non-bending area, respectively, such that the first control area is between the second control area and the third control area, and a thickness of a central portion, which overlaps with the bending axis, of the first control area is less than a thickness of an end of the second control area spaced apart from the first control area in the second direction and a thickness of an end of the third control area spaced apart from the first control area in the second direction.

The stress control member may include a first surface contacting the outer member, and a second surface opposite to the first surface of the stress control member. In a non-bending state, the first surface of the stress control member may be a flat surface and the second surface may be a curved surface.

The display panel may include an opposite surface opposite to the first surface of the display panel, the second surface may contact the opposite surface, and the opposite surface may have a shape corresponding to the second surface.

The stress control member may have a thickness which gradually increases as the stress control member is farther away from the bending axis in the second direction.

The thickness of the stress control member may be linearly increased.

The central portion may have a thickness in a range of 50 µm or more to 150 µm or less.

The end of each of the second control area and the third control area may have a thickness in a range of 150 µm or more to 300 µm or less.

The first control area may have a uniform thickness.

Each of the second control area and the third control area may have a thickness which linearly increases as the second control area and the third control area, respectively, is farther away from the bending axis in the second direction.

Each of the second control area and the third control area may have a thickness which nonlinearly increases as the second control area and the third control area, respectively, is farther away from the bending axis in the second direction.

The stress control member may include a pressure sensitive adhesive (PSA).

The stress control member may contact the outer member.

The flexible display device may further include an additional member between the outer member and the display panel and including an organic material.

According to one or more embodiments, a flexible display device includes a display panel including a bending area bendable about a bending axis extending in a first direction, and a first non-bending area and a second non-bending area spaced apart from each other in a second direction crossing the first direction with the bending area between the first non-bending area and the second non-bending area, an outer member over a first surface of the display panel, and a stress control member between the display panel and the outer member and including a first surface contacting the outer member and a second surface opposite to the first surface of the stress control member, and, in a non-bending state, the first surface of the stress control member is a flat surface and the second surface is a curved surface.

The stress control member may include a first control area overlapping with the bending area and a second control area and a third control area overlapping with the first non-bending area and the second non-bending area, respectively, such that the first control area is between the second control area and the third control area. The thickness of a central portion, which overlaps with the bending axis, of the first control area may be less than a thickness of an end of the second control area spaced apart from the first control area in the second direction and a thickness of an end of the third control area spaced apart from the first control area in the second direction.

The stress control member may have a thickness which gradually increases as the stress control member is farther away from the bending axis in the second direction.

The first control area may have a uniform thickness.

The central portion may have a thickness in a range of 50 µm or more to 150 µm or less, and the end of each of the second control area and the third control area may have a thickness in a range of 150 µm or more to 300 µm or less.

The display panel may include an opposite surface opposite to the first surface of the display panel, the second surface may contact the opposite surface, and the opposite surface may have a shape corresponding to the second surface.

The stress control member may include a pressure sensitive adhesive (PSA).

According to an aspect of embodiments of the inventive concept, a delamination phenomenon occurring in bending may be avoided by minimizing or reducing the thickness of the first control area, which overlaps with the bending area, of the thickness of the stress control member.

Accordingly, there may be provided the flexible display device having improved reliability.

BRIEF DESCRIPTION OF THE FIGURES

The above and other aspects and features will become apparent from the following description with reference to the following figures, wherein like reference numerals refer to like parts throughout the various figures unless otherwise specified, and wherein.

DETAILED DESCRIPTION

Figure 1A:
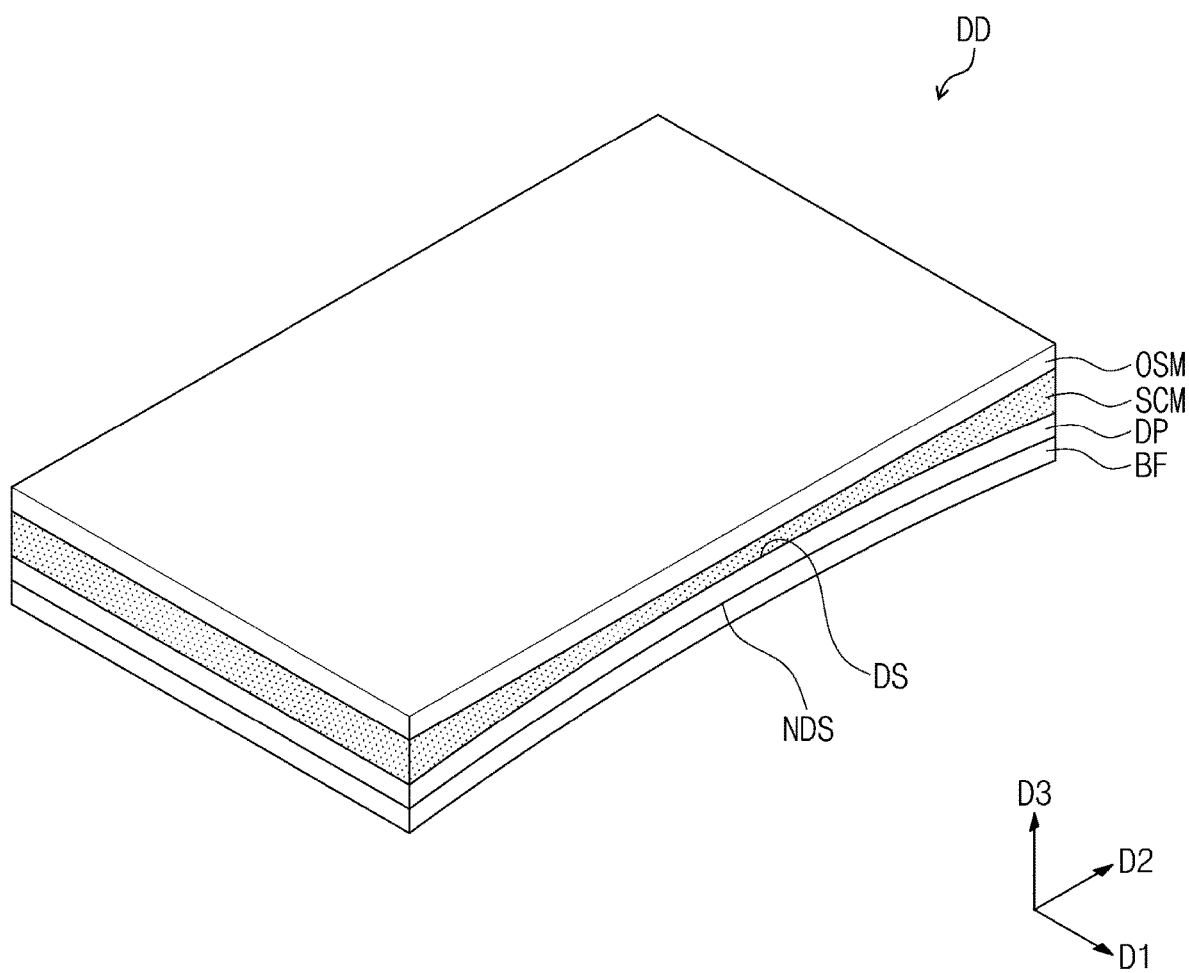
FIG. 1A is a perspective view of a flexible display device in a spreading state, according to an embodiment of the inventive concept.

In this specification, it is to be understood that, when a component is referred to as being "on," "connected to," or "coupled" to another component, it may be directly disposed on, connected to, coupled to the another component or one or more third intervening components may be present therebetween.

The same reference numerals will be assigned to same components. The thickness, ratio, and/or size of each components illustrated in the drawings may be exaggerated for the purpose of effectively explaining the technical content.

The term "and/or" includes any and all combinations of one or more of associated components Although the terms "first," "second," etc. may be used herein to describe various components, these components should not be limited by these terms. These terms are used to distinguish one component from another component. For example, a first component discussed below could be termed a "second" component without departing from the technical scope of the inventive concept. Similarly, the second component could be termed a "first" component. The singular forms are intended to include the plural forms unless the context clearly indicates otherwise.

In addition, terms such as "under," "at a lower portion," "above," "at an upper portion" are used to explain the relationship between components illustrated in the drawings. The terms indicate a relative concept and may be described with reference to directions illustrated in the drawings.

Unless otherwise defined, all terms used herein (including technical or scientific terms) have the same meanings as those generally understood by those skilled in the art to which the inventive concept pertains. Such terms as those defined in a generally used dictionary are to be interpreted as having meanings equal to the contextual meanings in the relevant field of art, and are not to be interpreted as having idealized or excessively formal meanings unless clearly defined herein.

It is to be further understood that the terms "comprises," "comprising," "includes," "including," or "having" specify the presence of stated features, numbers, steps, operations, components, parts, or the combination thereof, but do not preclude the presence or addition of one or more other features, numbers, steps, operations, components, parts, and/or the combination thereof. Herein, some example embodiments of the inventive concept will be described with reference to accompanying drawings.

Figure 1B:
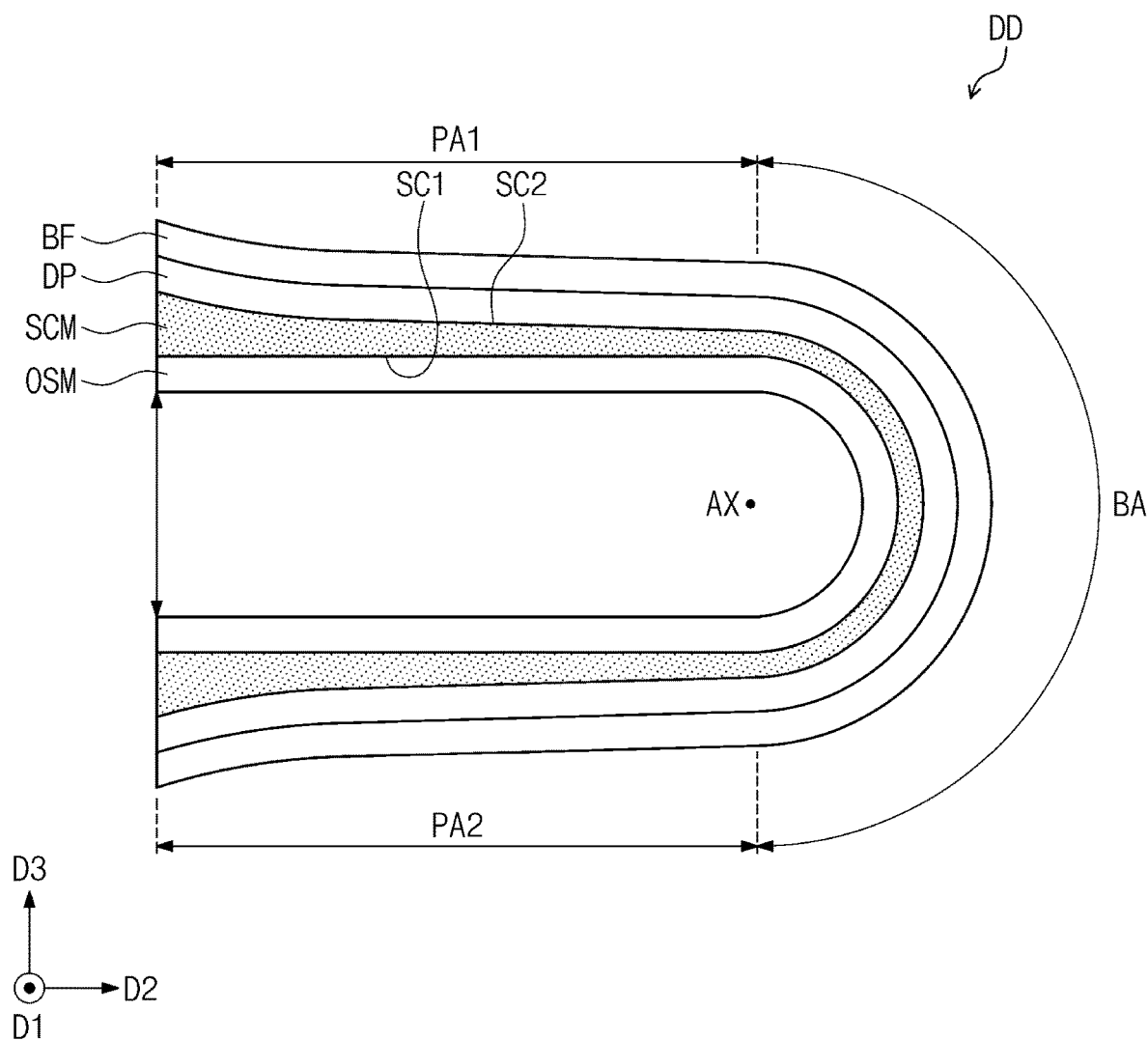
FIG. 1B is a cross-sectional view of a flexible display device in a bending state, according to an embodiment of the inventive concept.
Figure 1C:
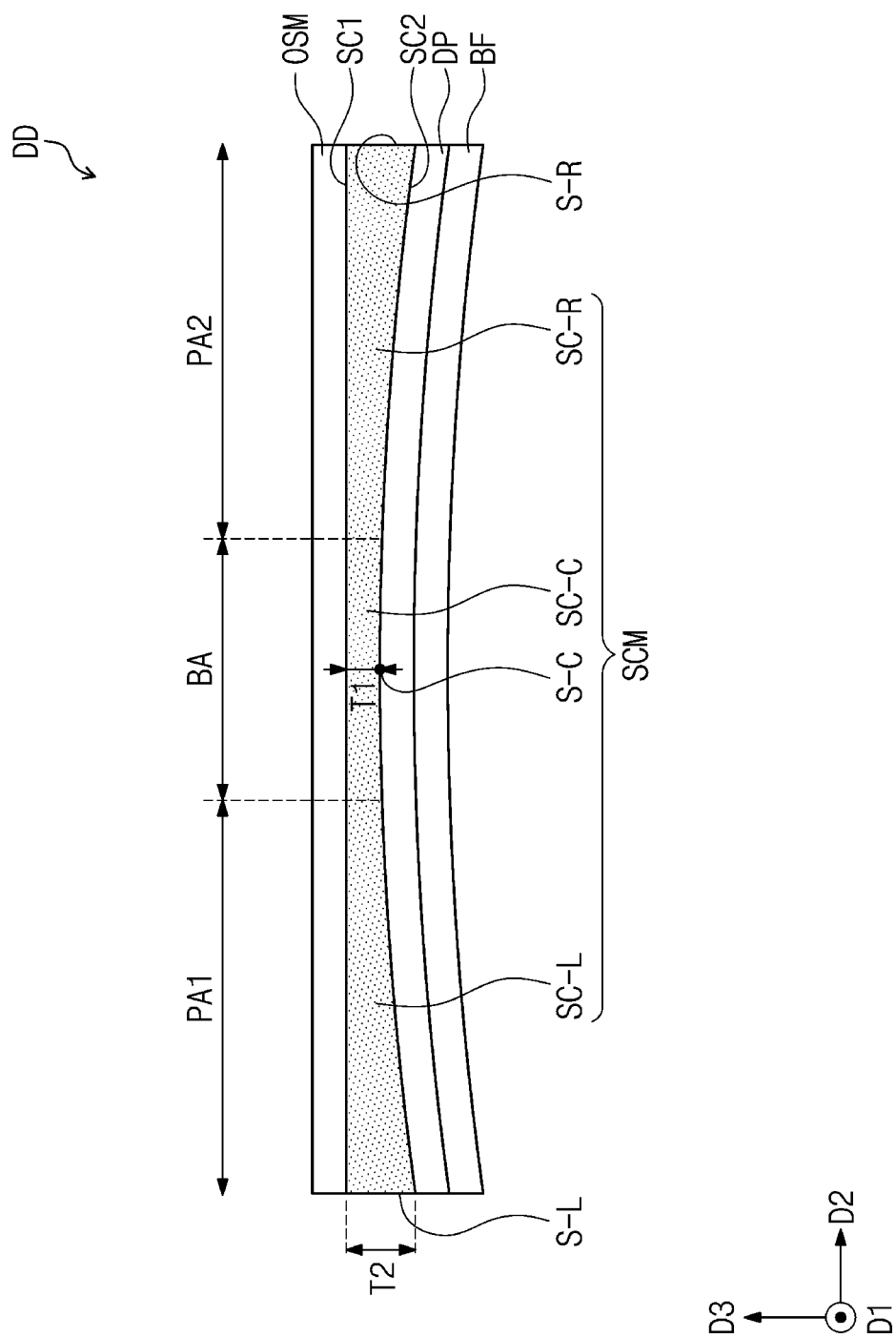
FIG. 1C is a cross-sectional view of a flexible display device, according to an embodiment of the inventive concept.
Figure 2:
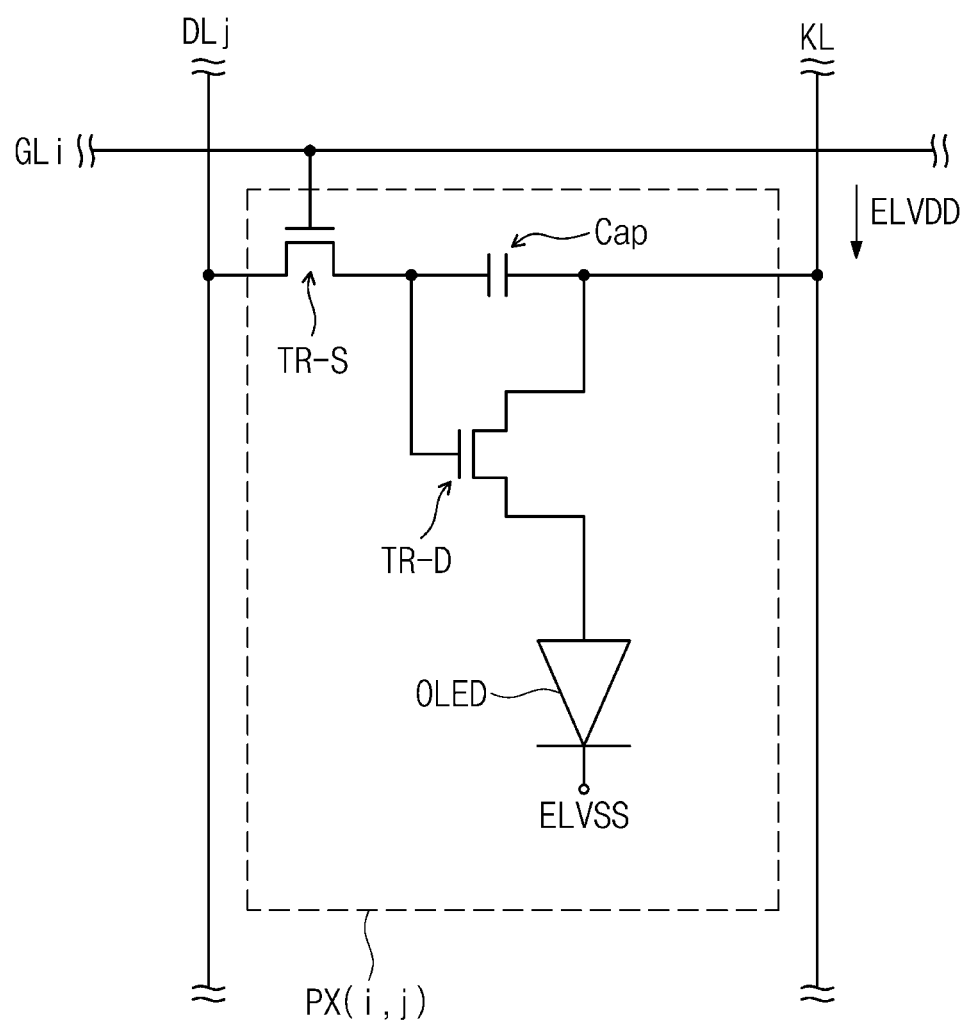
FIG. 2 is an equivalent circuit diagram of a pixel, according to an embodiment of the inventive concept.

FIG. 1A is a perspective view of a flexible display device in a spreading state, according to an embodiment of the inventive concept; FIG. 1B is a cross-sectional view of the flexible display device in a bending state, according to an embodiment of the inventive concept; and FIG. 1C is a cross-sectional view of the flexible display device, according to an embodiment of the inventive concept. FIG. 2 is an equivalent circuit diagram of a pixel, according to an embodiment of the inventive concept.

As illustrated in FIG. 1A, in an embodiment, a flexible display device DD includes an outer member OSM, a stress control member SCM, a display panel DP, and a protective member BF.

The display panel DP includes a display surface DS defined by a first direction D1 and a second direction D2 crossing the first direction, and a non-display surface NDS opposite to the display surface DS. The display surface DS may be defined as the surface covered by the stress control member SCM. The display panel DP displays an image to the outside through the display surface DS. However, embodiments of the inventive concept are not limited thereto. In another embodiment of the inventive concept, a display panel displaying images on opposite surfaces thereof may be employed.

The display panel DP may be any one of an organic light emitting display panel, an electrophoretic display panel, and an electro-wetting display panel, for example. In an embodiment, the display panel DP may be the organic light emitting display panel. The display panel DP includes a flexible base layer (not illustrated), signal wirings (not illustrated) disposed on the base layer, insulating layers (not illustrated) disposed on the base layer, and pixels (not illustrated) electrically connected with the signal wirings. Each of the pixels includes a display element and a circuit part to control the display element.

In FIG. 2, an equivalent circuit of one pixel PX (i, j) of the pixels is illustrated by way of example. The configuration of the pixel PX (i, j) is not limited thereto, but may be modified to be implemented. The pixel PX (i, j) receives a gate signal from an $i^{th}$ gate line GLi and receives a data signal from a $j^{th}$ data line DLj. The pixel PX (i, j) receives a first power supply voltage ELVDD from a power supply line KL. The pixel PX (i, j) includes an organic light emitting diode OLED as the display element.

The pixel PX (i, j) includes a switching thin film transistor TR-S, a driving thin film transistor TR-D, and a capacitor Cap, as a circuit part to the organic light emitting diode OLED.

The switching thin film transistor TR-S outputs a data signal applied to the $j^{th}$ data line DLj in response to a gate voltage applied to the $i^{th}$ gate line GLi. The capacitor Cap is charged with a voltage corresponding to the data signal received from the switching thin film transistor TR-S.

The driving thin film transistor TR-D is connected to the organic light emitting diode OLED. The driving thin film transistor TR-D controls a driving current flowing through the organic light emitting diode OLED, corresponding to the quantity of charges stored in the capacitor Cap. The organic light emitting diode OLED emits light for a turn-on period of the driving thin film transistor TR-D.

The capacitor Cap may be provided in a plurality of insulating layers included in the pixel PX (i, j). Two electrodes constituting the capacitor Cap may be disposed on mutually different layers of the plurality of insulating layers, respectively. The two electrodes included in the capacitor Cap may constitute a part of the organic light emitting diode OLED.

Referring back to FIG. 1A, the outer member OSM is disposed on the stress control member SCM. The outer member OSM may include at least one of a window member, a touch panel, and an optical member. In an embodiment, the outer member OSM may include a plurality of members among the above-described members. The plurality of members may be stacked in a third direction D3 perpendicular to the display panel DP.

The stress control member SCM is interposed between the outer member OSM and the display panel DP. According to an embodiment, the stress control member SCM may cover the display surface DS of the display panel DP.

In an embodiment of the inventive concept, the stress control member SCM couples the display panel DP to the outer member OSM. In an embodiment, the stress control member SCM may be a pressure sensitive adhesive (PSA). The pressure sensitive adhesive may include a polymer, a crosslinking agent, and resin. The polymer may include at least one of an acrylic-based material, a silicone-based material, and a urethane-based material.

The pressure sensitive adhesive may be provided in any of various forms, for example, the form of a sheet. The pressure sensitive adhesive sheet includes a part having higher viscosity and a part having higher elasticity in a thickness direction thereof. In an embodiment, the part having higher viscosity forms an outer surface of the pressure sensitive adhesive sheet, and the part having higher elasticity forms an inner layer of the pressure sensitive adhesive sheet. In the present embodiment, the stress control member SCM is not limited to the pressure sensitive adhesive sheet. For example, the stress control member SCM may employ another adhesive member including an inner layer having elasticity and an outer layer having viscosity.

The protective member BF is disposed under the display panel DP. The protective member BF may be coupled to a lower portion of the display panel DP by an adhesive layer, which is not illustrated, to protect the display panel DP from an external impact.

According to an embodiment, the protective member BF may include a plurality of layers. In an embodiment, for example, the protective member BF includes a light shielding layer, a heat radiating layer, a cushion layer, and a plurality of adhesive layers.

The light shielding layer may improve a problem that components disposed on the rear surface of the display panel DP may be viewed from the outside. Although not illustrated, the light shielding layer may include a binder and a plurality of pigment particles dispersed in the binder. The pigment particles may include carbon black.

According to an embodiment of the inventive concept, the flexible display device DD includes the protective member BF including the light shielding layer, thereby improving impact resistance and a light shielding property. In addition, there may be provided a flexible display device DD having improved reliability for the external impact or stress caused during the use thereof.

The heat radiating layer may effectively radiate heat produced from the display panel DP. The heat radiating layer may include at least one of graphite, copper (Cu), and aluminum (Al) having an excellent heat radiation property, but is not limited thereto. The heat radiating layer may not only improves the heat radiation property, but may have a property of suppressing or absorbing an electromagnetic wave.

The cushion layer may be synthetic resin foam. The cushion layer comprises a matrix member and a plurality of pores. The plurality of pores may be defined by being dispersed in the matrix member. According to an embodiment, the cushion layer may be disposed under the heat radiating layer. The cushion layer may have elasticity and may have a porous structure.

The matrix member may include a flexible material. For example, the matrix member may include a synthetic resin. For example, the matrix member may include at least one of an acrylonitrile butadiene styrene copolymer (ABS), polyurethane (PU), polyethylene (PE), ethylene vinyl acetate (EVA), and polyvinyl chloride (PVC).

The plurality of pores may easily absorb an impact applied to the cushion layer. The plurality of pores may be defined as the cushion layer has a porous structure. The plurality of pores may allow the cushion layer to be easily deformed to improve the elasticity of the cushion layer, thereby improving the impact resistance of a support member. The cushion layer may include any of a plurality of synthetic resins, and is not limited to any one embodiment.

As illustrated in FIG. 1B, the flexible display device DD may be bent in an area (e.g., a specific area). In FIG. 1B, the flexible display device DD may be bent such that the display surface DS faces inward. The stress control member SCM includes a first surface SC1 and a second surface SC2 opposite to the first surface SC1. According to an embodiment, the first surface SC1 may make contact with the outer member OSM, and the second surface SC2 may make contact with the display panel DP. The flexible display device DD may be bent such that the first surface SC1 faces inward, as the display surface DS is bent to face inward.

As the flexible display device DD is bent, the flexible display device DD may be divided into a bending area BA, a first non-bending area PA1, and a second non-bending area PA2. The first non-bending area PA1 and the second non-bending area PA2 may be spaced apart from each other while interposing the bending area BA therebetween in the second direction D2.

The first non-bending area PA1 and the second non-bending area PA2 are deformed less than the bending area BA. In an embodiment, the first non-bending area PA1 and the second non-bending area PA2 may not provide a flat surface. In another embodiment of the inventive concept, the flexible display device DD may be curved or rolled to form a curved surface as a whole. In this case, the first non-bending area PA1 or the second non-bending area PA2 may include at least one curved surface.

The flexible display device DD has a radius of curvature and a bending angle (e.g., a predetermined radius of curvature and a predetermined bending angle), in a bending state. The flexible display device DD may include a virtual bending axis AX extending in the first direction D1. The radius of curvature is defined as the shortest distance between the bending axis AX and the flexible display device DD. For example, the radius of curvature (RC) may be the shortest distance from the bending axis AX to the outer member OSM in the bending area BA. In general, as the radius of curvature increases, the ratio of the bending area BA occupying the flexible display device DD is relatively increased, when compared with a flexible display device having the same area.

The bending angle may be defined as an angle formed by the first non-bending area PA1 and the second non-bending area PA2 in the state that the flexible display device DD is bent. For example, as illustrated in FIG. 1B, the bending angle of the flexible display device DD is defined as 180 degrees when the flexible display device DD has a shape bent such that the first non-bending area PA1 and the second non-bending area PA2 are parallel to each other.

The bending angle may be variously adjusted. In an embodiment, the flexible display device DD may be bent at 120 degrees such that the first non-bending area PA1 and the second non-bending area PA2 form an included angle of 60 degrees, or may be bent at 90 degrees such that the first non-bonding area PA1 and the second non-bending area PA2 form an included angle of 90 degrees. However, the inventive concept is not limited thereto, and the included angle between the first non-bending area PA1 and the second non-bending area PA2 of the flexible display device DD may vary from 0 degree to 180 degrees.

Although FIG. 1B illustrates that the flexible display device DD is bent such that the outer member OSM is disposed in an inner portion thereof, the flexible display device DD may be bent such that the outer member OSM is disposed in an outer portion thereof depending on the usage state of the flexible display device DD.

FIG. 1C is a cross-sectional view of the flexible display device DD in a non-bending state. According to an embodiment, the stress control member SCM may include a first control area SC-C, a second control area SC-L, and a third control area SC-R. The second control area SC-L and the third control area SC-R may be spaced apart from each other while interposing the first control area SC-C therebetween in the second direction D2.

The first control area SC-C may be defined as an area overlapping with the bending area BA. The second control area SC-L and the third control area SC-R may overlap with the first non-bending area PA1 and the second non-bending area PA2, respectively.

According to embodiments of the inventive concept, the first surface SC1 and the second surface SC2 of the stress control member SCM may have different shapes. For example, the first surface SC1 making contact with the outer member OSM may be a flat surface in the non-bending state. The second surface SC2, which is opposite to the first surface SC1, may be a curved surface in the non-bending state.

According to an embodiment, the stress control member SCM may have mutually different thicknesses in the first to third control areas SC-C, SC-L, and SC-R. For example, the stress control member SCM may have a minimum thickness in the first control area SC-C. In addition, the stress control member SCM may have a maximum thickness in at least one of the second control area SC-L and the third control area SC-R. According to an embodiment of the inventive concept, the thickness may be defined as the length in the third direction D3.

The minimum thickness of the stress control member SCM may be a first thickness T1 of a central part S-C, which overlaps with the bending axis AX, in the first control area SC-C. In an embodiment, the first thickness T1 of the central part S-C may be 50 micrometer (herein, written as "μm") to 150 μm or less. When the first thickness T1 of the central part S-C is less than 50 μm, the thickness of a portion of the stress control member SCM, which is adjacent to the outer member OSM, is thin, such that a crack may be made due to tensile stress in the bending state. When the first thickness T1 of the central part S-C exceeds 150 μm, the stress control member SCM may be delaminated from the display panel DP and the outer member OSM as the stress control member SCM is away from the bending axis AX in the second direction due to the thickness of the central part S-C in bending. In addition, as the thickness of the central part S-C becomes thicker, the radius of curvature is increased, such that the thickness of the flexible display device DD increases in the bending state.

According to embodiments of the inventive concept, the thickness of the central part S-C may be defined as a thickness of a part of the first control area SC-C, which overlaps with the bending axis AX in the first direction D1, in the third direction D3. Each of the central parts S-C illustrated in FIGS. 1C, 5, 6, 7, and 8 are indicated as one point when viewed from the cross-sectional view for the convenience of explanation.

In an embodiment, the maximum thickness of the stress control member SCM may be the second thicknesses T2 of ends S-L and S-R of the second control area SC-L and the third control area SC-R spaced in the second direction D2 from the bending axis AX.

In an embodiment, the second thicknesses T2 of the ends S-L and S-R of the second control area SC-L and the third control area SC-R may be 150 μm or more and 300 μm or less. When the second thicknesses T2 of the ends S-L and S-R is less than 150 μm, the impact resistance of the flexible display device DD may be reduced. When the second thickness T2 of the ends S-L and S-R exceeds 300 μm, the thickness of the flexible display device DD may be increased.

According to an embodiment, the thickness of the stress control member SCM may gradually increase as the stress control member SCM is farther away from the central portion S-C in the second direction D2 from the bending axis AX. Accordingly, the second surface SC2 on the sectional surface taken in the second direction D2 may have a curved line.

According to embodiments of the inventive concept, the maximum thickness of the first control area SC-C may be less than the thicknesses of the ends S-L and S-R of the second control area SC-L and the third control area SC-R.

In an embodiment, the average thicknesses of the first control area SC-C may be less than minimum thicknesses of the second control area SC-L and the third control area SC-R.

Figure 3:
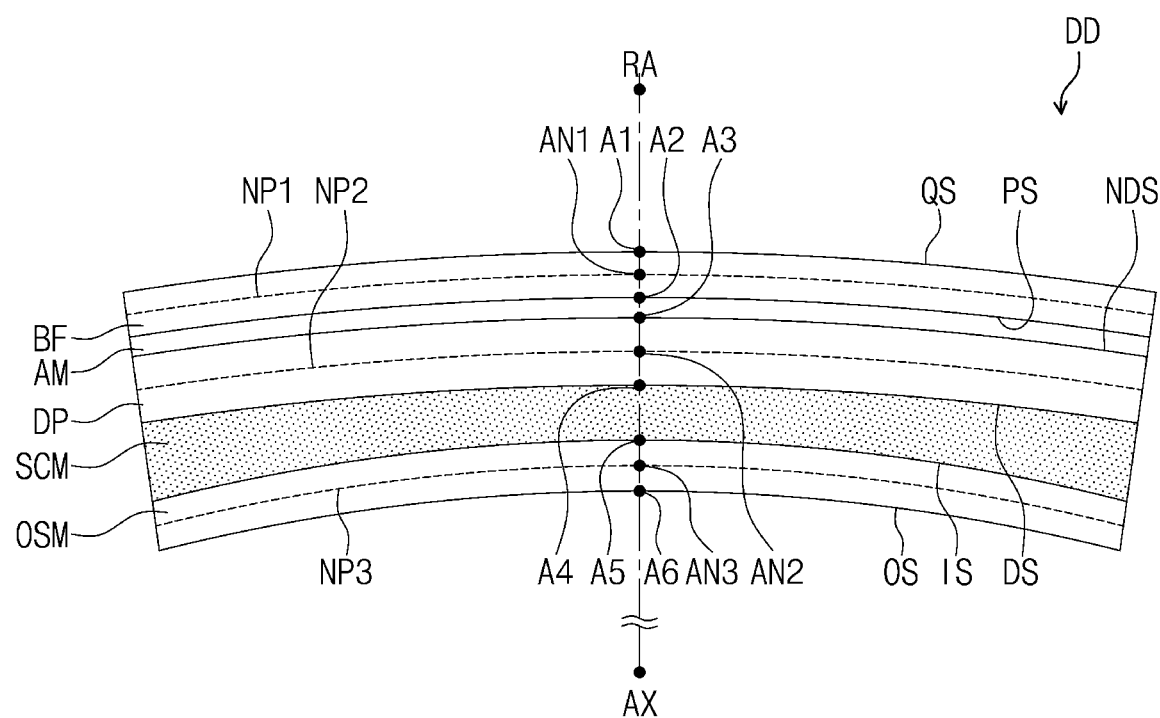
FIG. 3 is a cross-sectional view of a flexible display device in a bending state, according to an embodiment of the inventive concept.
Figure 4A:
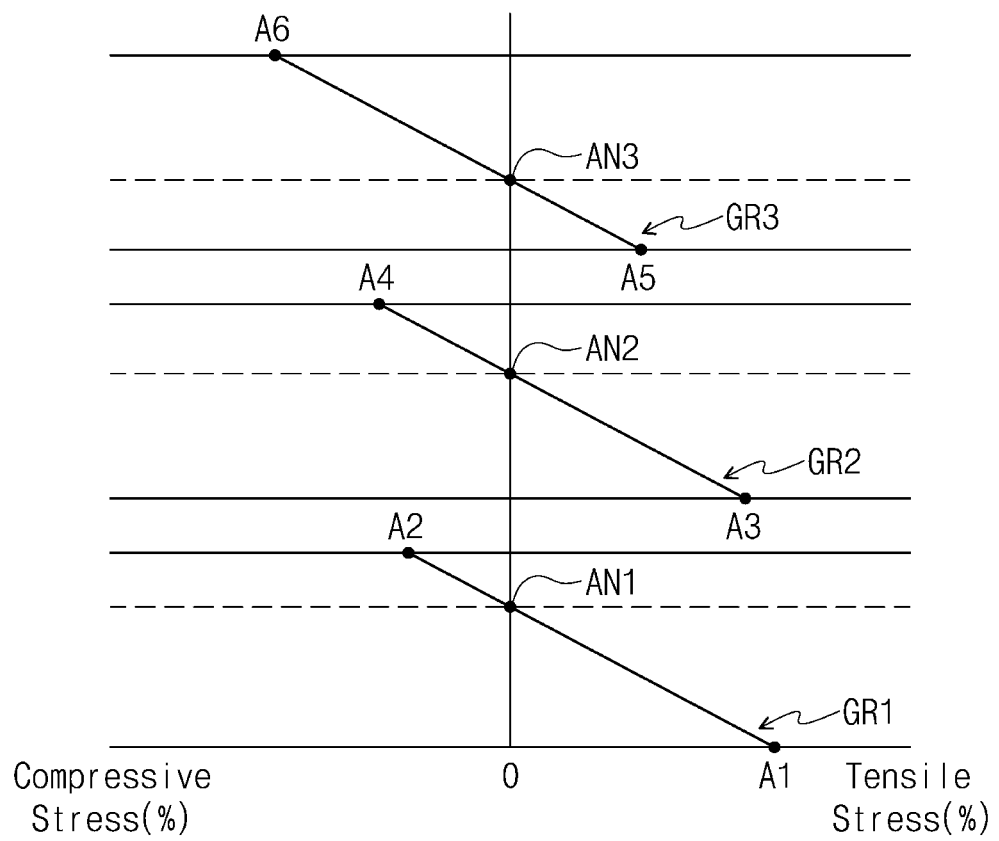
FIG. 4A shows graphs illustrating strain on the display device illustrated in FIG. 3.
Figure 4B:
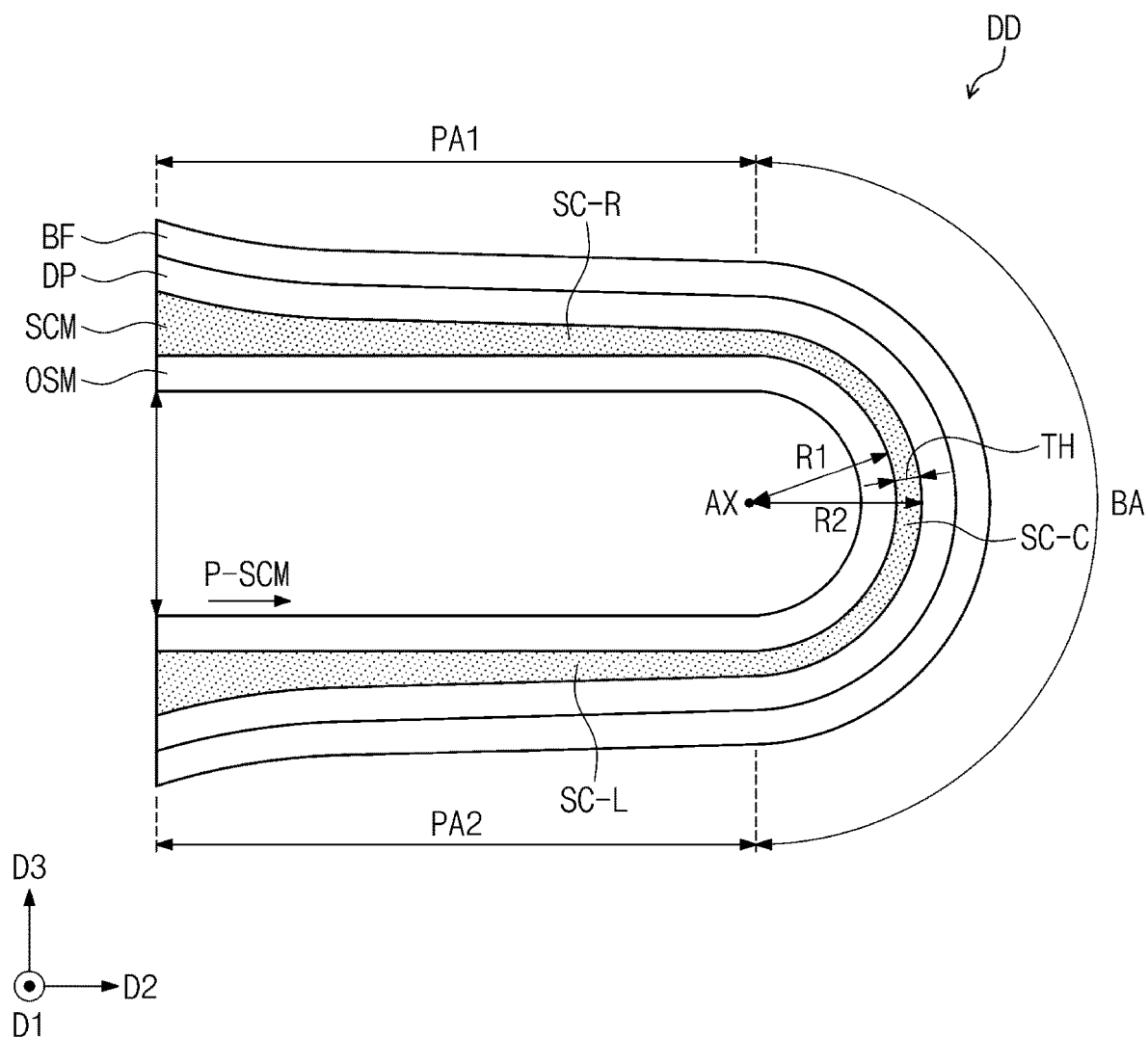
FIG. 4B is a cross-sectional view for illustrating a method for measuring the strain on the display device.

FIG. 3 is a cross-sectional view of a flexible display device in a bending state, according to an embodiment of the inventive concept; FIG. 4A shows graphs illustrating strain caused on the display device illustrated in FIG. 3; and FIG. 4B is a cross-sectional view for illustrating a method for measuring the strain caused on the display device.

As illustrated in FIG. 3, when the flexible display device DD is bent, a plurality of neutral surfaces NP1, NP2, and NP3, which are partially mutually different from each other, may be defined. The stress control member SCM physically couples the display panel DP to the outer member OSM. In an embodiment, the flexible display device DD may include an adhesive layer AM to physically couple the display panel DP and the protective member BF to each other. However, the adhesive layer AM to couple the display panel DP to the protective member BF is omitted from FIGS. 1A to 1C for the convenience of explanation.

The stress control member SCM partially decouples the display panel DP from the outer member OSM in terms of stress. Accordingly, the display panel DP and the outer member OSM receive stress independently from each other, based on the stress control member SCM. When the flexible display device DD is bent, mutually different neutral surfaces NP3, NP2, and NP1 are generated in the outer member OSM, the display panel DP, and the protective member BF, respectively.

Graphs GR1, GR2, and GR3 illustrated in FIG. 4A represent strains caused on the flexible display device DD. The graphs GR1, GR2, and GR3 include strains caused on nine points A1, A2, A3, A4, A5, A6, AN1, AN2, and AN3. The nine points A1, A2, A3, A4, A5, A6, AN1, AN2, and AN3 are placed on a reference line RA in FIG. 3 extending from the bending axis AX and perpendicular to the display surface DS of the display panel DP.

The strain depends on the magnitude and direction of the stress applied to a part where the strain is measured. Since the display panel DP and the outer member OSM are partially decoupled from each other, and the display panel DP and the protective member BF are partially decoupled from each other in terms of stress, the display surface DS of the display panel DP and an inner surface IS of the outer member OSM have strains caused due to mutually different stresses of compressive stress and tensile stress.

Regarding the protective member BF, in bending, a maximum compressive stress is applied to an inner surface PS, which makes contact with the adhesive member AM, of the protective member BF, and a maximum tensile stress is applied to an outer surface QS opposite to the inner surface PS, based on the neutral surface NP1 of the protective member BF.

Regarding the display panel DP, in bending, a maximum compressive stress is applied to the display surface DS, which makes contact with the control member SCM, and a maximum tensile stress is applied to the non-display surface NDS, based on the neutral surface NP2 of the display panel DP.

Regarding the outer member OSM, in bending, a maximum tensile stress is applied to the inner surface IS making contact with the stress control member SCM and a maximum compressive stress is applied to an outer surface OS closer to the bending axis AX than the inner surface IS, based on the neutral surface NP3 of the outer member OSM.

Accordingly, the outer surface QS of the protective member BF and the inner surface PS of the protective member BF have strains caused by mutually different stress of compressive stresses and tensile stresses. Tensile strain is caused at a first point A1 which is one point of the outer surface QS of the protective member BF, and compressive strain is caused at a second point A2 which is one point of the inner surface PS of the protective member BF.

The non-display surface NDS of the display panel DP and the display surface DS of the display panel DP have strains caused by mutually different stress of compressive stresses and tensile stresses. Tensile strain is caused at the third point A3 which is one point of the non-display surface NDS of the display panel DP, and compressive strain is caused at the fourth point A4 which is one point of the display surface DS of the display panel DP.

In addition, the inner surface IS of the outer member OSM and the outer surface OS of the outer member OSM have strains caused by mutually different stress selected from compressive stresses and tensile stresses. Tensile strain is caused at the fifth point A5 which is one point of the inner surface IS of the outer member OSM, and compressive strain is caused at the sixth point A6 which is one point of the outer surface OS of the outer member OSM.

Compressive stress and tensile stress having the same magnitude act on the first neutral point AN1 which is one point of the neutral surface NP1 defined on the protective member BF. Compressive stress and tensile stress having the same magnitude act on the second neutral point AN2 which is one point of the neutral surface NP2 of the display panel DP. In addition, compressive stress and tensile stress having the same magnitude act on the third neutral point AN3 which is one point of a neutral surface NP3 of the outer member OSM. Accordingly, as illustrated in FIG. 4A, actual strain is not caused at the first to third neutral points AN1, AN2, and AN3.

As illustrated in FIG. 4A, since the outer member OSM is disposed on the inner side and the display panel DP is disposed on the outer side with respect to the direction in which the flexible display device DD is bent, greater compressive strain is caused at the sixth point A6 than at the fourth point A4. For the same reason, greater tensile strain is caused at the third point A3 than at the fifth point A5. In another use aspect, when the flexible display device DD is bent in the opposite direction, greater compressive strain is caused at the display panel DP than at the outer member OSM.

Referring to FIG. 4B, when the flexible display device DD is bent, the stress control member SCM is subject to shear stress.

$$d=\pi*(R2-R1)\approx\pi TH \qquad \text{Equation 1}$$

Referring to Equation 1, a pushed length "d" is generated to be required to be pushed in the second direction D2 due to the difference between the bend radiuses R1 of the outer member OSM and R2 of the display panel DP disposed at the inner side and the stress control member SCM disposed at the outer side from the bending axis AX.

The pushed length "d" may be in proportion to the difference between the bend radius R2 of the stress control member SCM and the bend radius R1 of the outer member OSM. The difference between the bend radius R2 and the bend radius R1 may be in proportion to a thickness TH of the stress control member SCM.

$$P\text{-}SCM=d/TH \qquad \text{Equation 2}$$

Referring to Equation 2, the stress control member SCM may have a pushing resistance P-SCM. Since the stress control member SCM may include an adhesive material for coupling the display panel DP to the outer member OSM, the pushing resistance P-SCM may be generated to allow the stress control member SCM to return to the direction opposite to the direction that the pushed length "d" is generated.

As the pushed length "d" and the pushing resistance P-SCM of the stress control member SCM positioned at the outer side are increased, compressive strain applied to the stress control member SCM is increased, such that the display panel DP and the outer member OSM making the stress control member SCM may be delaminated.

According to embodiments of the inventive concept, the delamination phenomenon occurring in bending may be avoided by minimizing or reducing the thickness of the first control area SC-C, which overlaps with the bending area BA, of the thickness of the stress control member SCM. Accordingly, there may be provided the flexible display device having improved reliability.

Figure 5:
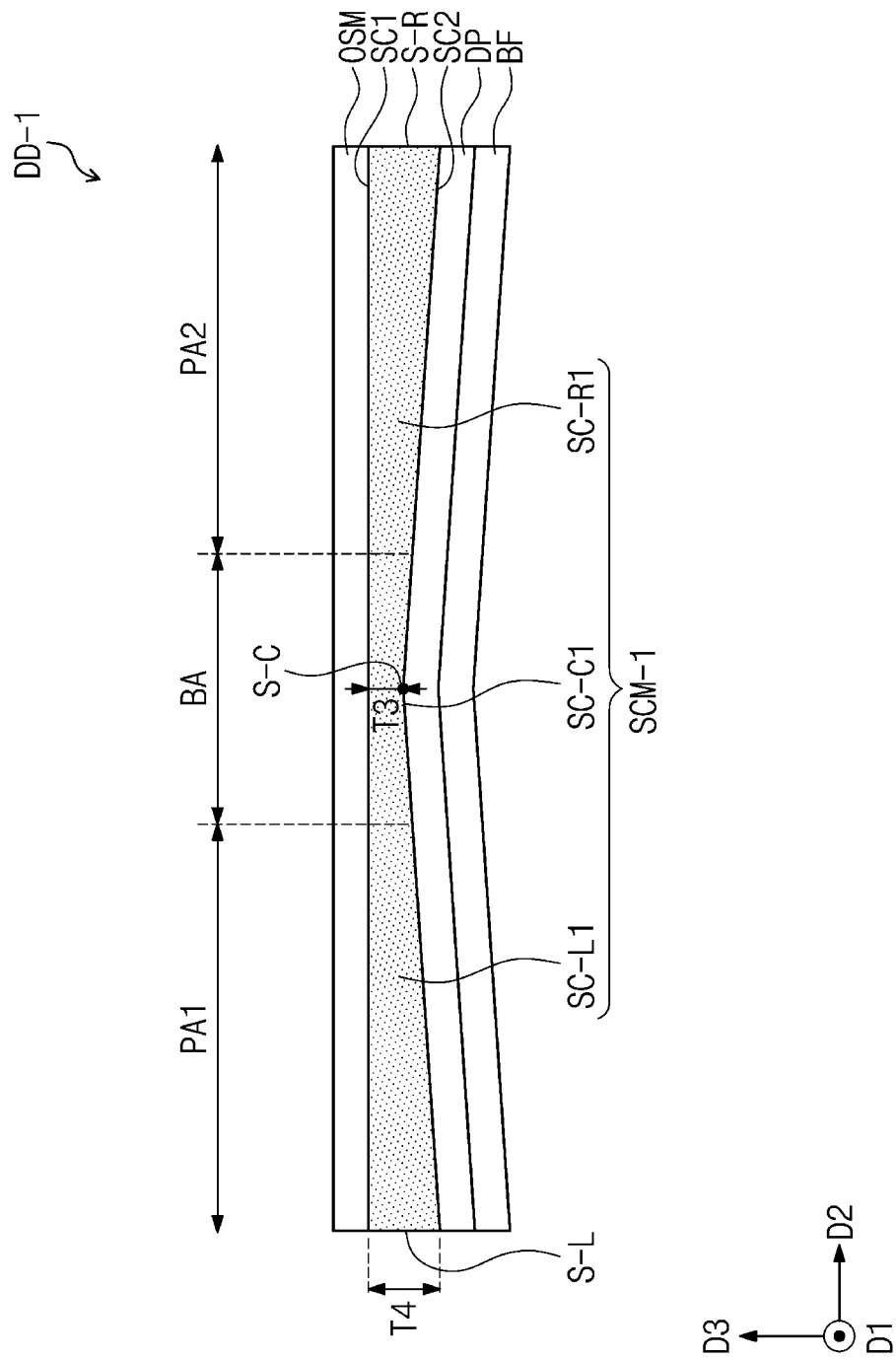
FIG. 5 is a cross-sectional view illustrating a flexible display device, according to an embodiment of the inventive concept.

FIG. 5 is a cross-sectional view illustrating a flexible display device, according to an embodiment of the inventive concept. Same or similar reference numerals will be assigned to the same or similar components to components described with reference to FIGS. 1A to 4B, and redundant details will be omitted.

Referring to FIG. 5, according to an embodiment, a stress control member SCM-1 of a flexible display device DD-1 may include a first control area SC-C1, a second control area SC-L1, and a third control area SC-R1. The second control area SC-L1 and the third control area SC-R1 may be spaced apart from each other with the first control area SC-C1 interposed therebetween in the second direction D2.

According to an embodiment, the stress control member SCM-1 may have mutually different thicknesses in the first to third control areas SC-C1, SC-L1, and SC-R1. For example, the stress control member SCM-1 may have a minimum thickness in the first control area SC-C1. In addition, the stress control member SCM-1 may have a maximum thickness in at least one of the second control area SC-L1 and the third control area SC-R1.

The minimum thickness of the stress control member SCM-1 may be a third thickness T3 of the central part S-C, which overlaps with the bending axis AX (see FIG. 1B), in the first control area SC-C1. The maximum thickness of the stress control member SCM-1 may be fourth thicknesses T4 which are thicknesses of ends S-L and S-R of the second control area SC-L1 and the third control area SC-R1 spaced apart in the second direction D2 from the bending axis AX.

According to an embodiment, the thickness of the stress control member SCM-1 may linearly increase as the stress control member SCM-1 is farther away from the central part S-C in the second direction D2 from the bending axis AX. Accordingly, a second surface SC2 may have a shape of a straight line being inclined from the central part S-C when viewed on a sectional surface taken along the second direction D2.

Figure 6:
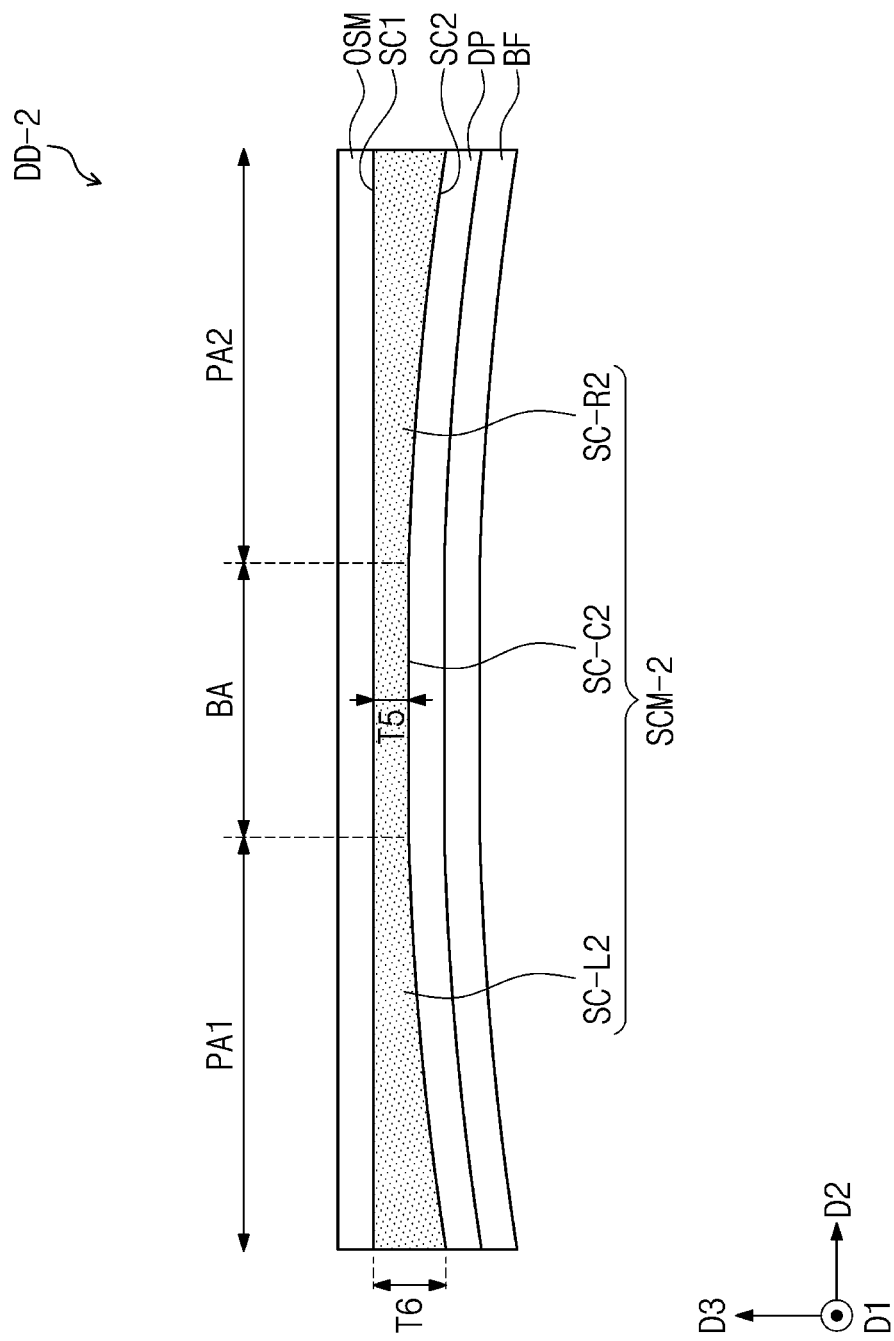
FIG. 6 is a cross-sectional view of a flexible display device, according to an embodiment of the inventive concept.

FIG. 6 is a cross-sectional view of a flexible display device, according to an embodiment of the inventive concept. Same or similar reference numerals will be used for same or similar components to components described with reference to FIGS. 1A to 4B, and the redundant details will be omitted.

Referring to FIG. 6, according to an embodiment, a stress control member SCM-2 of a flexible display device DD-2 may include a first control area SC-C2, a second control area SC-L2, and a third control area SC-R2. The second control area SC-L2 and the third control area SC-R2 may be spaced apart from each other with the first control area SC-C2 interposed therebetween in the second direction D2.

According to an embodiment, the stress control member SCM-2 may have mutually different thicknesses in the first to third control areas SC-C2, SC-L2, and SC-R2. For example, the stress control member SCM-2 may have a minimum thickness in the first control area SC-C2. In addition, the stress control member SCM-2 may have a maximum thickness in at least one of the second control area SC-L2 and the third control area SC-R2.

According to an embodiment, the stress control member SCM-2 may have a fifth thickness T5 which is the minimum thickness in the first control area SC-C2. The maximum thickness of the stress control member SCM-2 may be sixth thicknesses T6 which are the thicknesses of ends of the second control area SC-L2 and the third control area SC-R2 spaced apart in the second direction D2 from the bending axis AX.

For example, the stress control member SCM-2 may have a uniform (uniform or substantially uniform) thickness in the first control area SC-C2. The thickness of the stress control member SCM-2 may gradually increase in the second direction D2 from the bending axis AX in the second control area SC-L2 extending from one end of the first control area SC-C2 and in the third control area SC-R2 extending from an opposite end of the first control area SC-C2.

Therefore, when viewed on a sectional surface taken along the second direction D2, the area of the second surface SC2 overlapping with the first control area SC-C2 has the shape of a straight line, and areas of the second surface SC2 overlapping with the second control area SC-L2 and the third control area SC-R2 may have the shape of a curved line.

Figure 7:
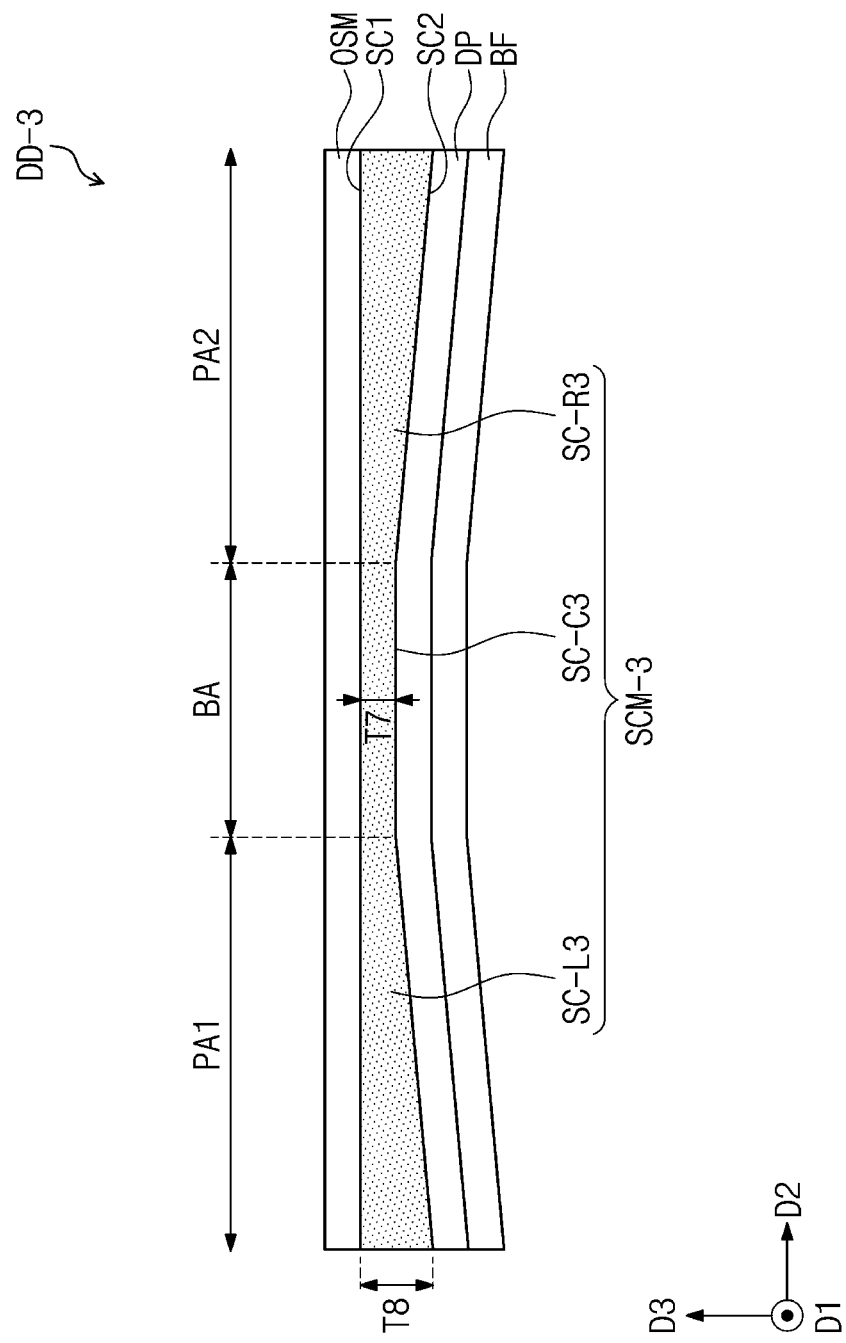
FIG. 7 is a cross-sectional view of a flexible display device, according to an embodiment of the inventive concept.

FIG. 7 is a cross-sectional view of a flexible display device, according to an embodiment of the inventive concept. Same or similar reference numerals are used for same or similar components to components described with reference to FIGS. 1A to 4B, and the redundant details will be omitted.

Referring to FIG. 7, according to an embodiment, a stress control member SCM-3 of a flexible display device DD-3 may include a first control area SC-C3, a second control area SC-L3, and a third control area SC-R3. The second control area SC-L3 and the third control area SC-R3 may be spaced apart from each other with the first control area SC-C3 interposed therebetween in the second direction D2.

According to an embodiment, the stress control member SCM-3 may have mutually different thicknesses in the first to third control areas SC-C3, SC-L3, and SC-R3. For example, the stress control member SCM-3 may have a minimum thickness in the first control area SC-C3. In addition, the stress control member SCM-3 may have a maximum thickness in at least one of the second control area SC-L3 and the third control area SC-R3.

According to an embodiment, the stress control member SCM-3 may have a seventh thickness T7 which is the minimum thickness in the first control area SC-C3. The maximum thickness of the stress control member SCM-3 may be an eighth thicknesses T8 which is the maximum thickness of ends of the second control area SC-L3 and the third control area SC-R3 spaced apart in the second direction D2 from the bending axis AX.

For example, the stress control member SCM-3 may have a uniform (uniform or substantially uniform) thickness in the first control area SC-C3. The thickness of the stress control member SCM-3 may linearly increase in the second direction D2 from the bending axis AX in the second control area SC-L3 extending from one end of the first control area SC-C3 and in the third control area SC-R3 extending from an opposite end of the first control area SC-C3.

Therefore, when viewed on a sectional surface taken along the second direction D2, the area of the second surface SC2 overlapping with the first control area SC-C3 has the shape of a straight line, and areas of the second surface SC2 overlapping with the second control area SC-L3 and the third control area SC-R3 may have the shape of a straight line.

Figure 8:
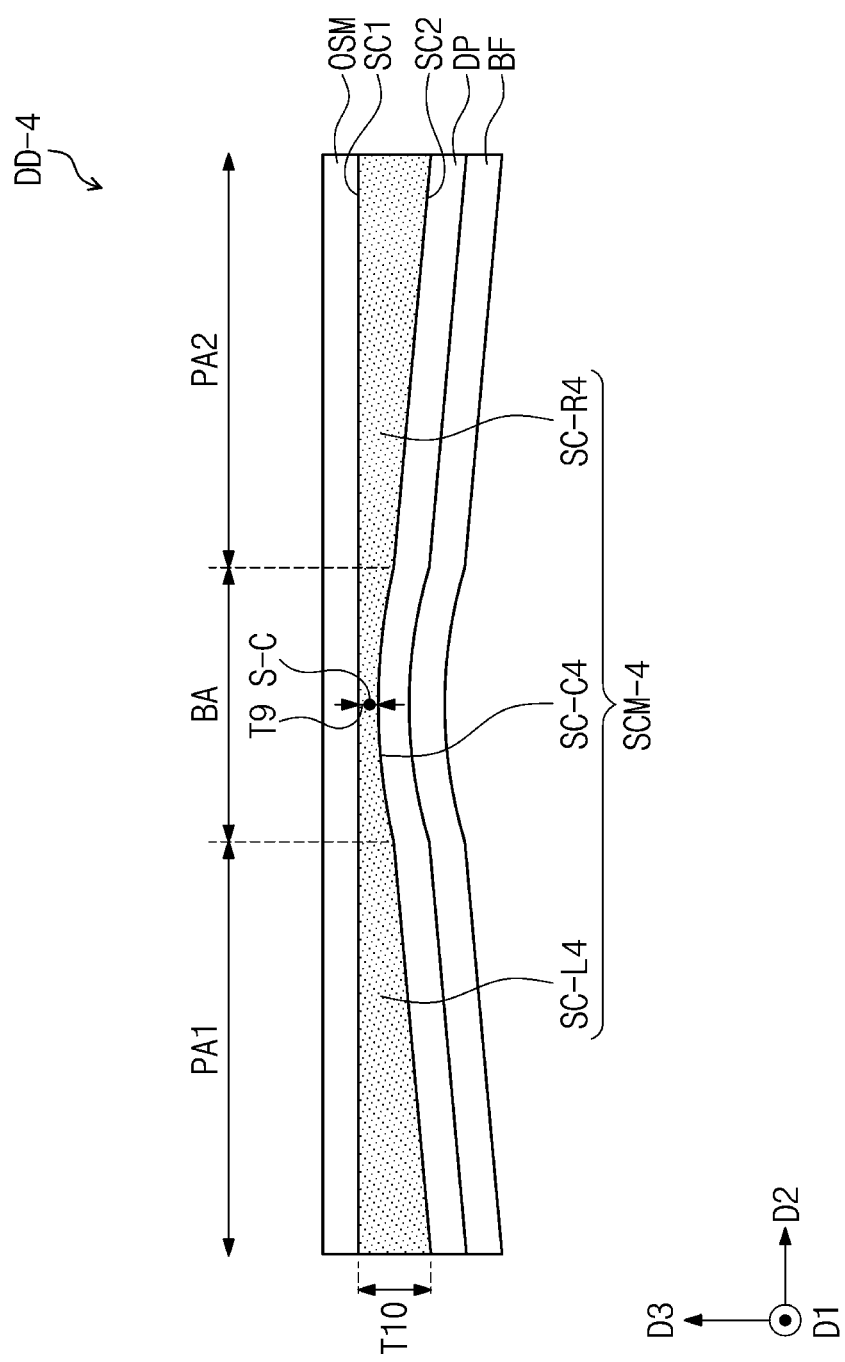
FIG. 8 is a cross-sectional view of a flexible display device, according to an embodiment of the inventive concept.

FIG. 8 is a cross-sectional view of a flexible display device, according to an embodiment of the inventive concept. Same or similar reference numerals are used for same or similar components to components described with reference to FIGS. 1A to 4B, and the redundant details will be omitted.

Referring to FIG. 8, according to an embodiment, a stress control member SCM-4 of a flexible display device DD-4 may include a first control area SC-C4, a second control area SC-L4, and a third control area SC-R4. The second control area SC-L4 and the third control area SC-R4 may be spaced apart from each other with the first control area SC-C4 interposed therebetween in the second direction D2.

According to an embodiment, the stress control member SCM-4 may have mutually different thicknesses in the first to third control areas SC-C4, SC-L4, and SC-R4. For example, the stress control member SCM-4 may have a minimum thickness in the first control area SC-C4. In addition, the stress control member SCM-4 may have a maximum thickness in at least one of the second control area SC-L4 and the third control area SC-R4.

According to an embodiment, the stress control member SCM-4 may have a ninth thickness T9 which is the minimum thickness in the first control area SC-C4. The minimum thickness of the stress control member SCM-4 may be the ninth thickness T9 of the central part S-C, which overlaps with the bending axis AX (see FIG. 1B), in the first control area SC-C4. The thickness of the stress control member SCM-4 may gradually increase in the first control area SC-C4, and may linearly increase in the second direction D2 from the bending axis AX in the second control area SC-L4 extending from one end of the first control area SC-C4 and the third control area SC-R4 extending from an opposite end of the first control area SC-C4.

Therefore, when viewed on a sectional surface taken along the second direction D2, the area of the second surface SC2 overlapping with the first control area SC-C4 has the shape of a curved line, and areas of the second surface SC2 overlapping with the second control area SC-L4 and the third control area SC-R4 may have the shape of a straight line.

According to embodiments of the inventive concept, a delamination phenomenon occurring in bending may be avoided by minimizing or reducing the thickness of the first control area, which overlaps with the bending area, of the thickness of the stress control member included in the flexible display device. Accordingly, there may be provided the flexible display device having improved reliability.

While the inventive concept has been described with reference to some example embodiments, it will be apparent to those skilled in the art that various changes and modifications may be made without departing from the spirit and scope of the inventive concept. Therefore, it is to be understood that the above-described embodiments are not limiting, but illustrative.

Accordingly, the technical scope of the inventive concept is not limited to the detailed description of this specification, but should be defined as set forth in the claims and equivalents thereof.

What is claimed is:

1. A flexible display device comprising:
   a display panel comprising a bending area bendable about a bending axis extending in a first direction, and a first non-bending area and a second non-bending area arranged to be spaced apart from each other in a second direction crossing the first direction with the bending area between the first non-bending area and the second non-bending area;
   an outer member over a first surface of the display panel; and
   a stress control member between the display panel and the outer member, and comprising a first control area overlapping with the bending area and a second control area and a third control area overlapping with the first non-bending area and the second non-bending area, respectively, such that the first control area is between the second control area and the third control area,
   wherein a maximum thickness of the first control area is less than a thickness of an end of the second control area spaced apart from the first control area in the second direction and a thickness of an end of the third control area spaced apart from the first control area in the second direction.

2. The flexible display device of claim 1, wherein the stress control member comprises:
   a first surface contacting the outer member, and a second surface opposite to the first surface of the stress control member, and
   wherein, in a non-bending state, the first surface of the stress control member is a flat surface and the second surface is a curved surface.

3. The flexible display device of claim 2, wherein the display panel comprises an opposite surface that is opposite to the first surface of the display panel,
   wherein the second surface contacts the opposite surface, and
   wherein the opposite surface has a shape corresponding to the second surface.

4. The flexible display device of claim 2, wherein the stress control member has a thickness which gradually increases as the stress control member is farther away from the bending axis in the second direction.

5. The flexible display device of claim 4, wherein the thickness of the stress control member linearly increases.

6. The flexible display device of claim 1, wherein a portion which overlaps with the bending axis in the first direction, of the first control area, is defined as a central portion, and the central portion has a thickness in a range of 50 μm or more to 150 μm or less.

7. The flexible display device of claim 1, wherein each of the end of the second control area and the end of the third control area has a thickness in a range of 150 μm or more to 300 μm or less.

8. The flexible display device of claim 1, wherein the first control area has a uniform thickness.

9. The flexible display device of claim 8, wherein each of the second control area and the third control area has a thickness which linearly increases as the second control area and the third control area, respectively, is farther away from the bending axis in the second direction.

10. The flexible display device of claim 8, wherein each of the second control area and the third control area has a thickness which nonlinearly increases as the second control area and the third control area, respectively, is farther away from the bending axis in the second direction.

11. The flexible display device of claim 1, wherein the stress control member comprises a pressure sensitive adhesive.

12. The flexible display device of claim 1, wherein the stress control member contacts the outer member.

13. The flexible display device of claim 1, further comprising an additional member between the outer member and the display panel and comprising an organic material.

14. A flexible display device comprising:
   a display panel comprising a bending area bendable about a bending axis extending in a first direction, and a first non-bending area and a second non-bending area spaced apart from each other in a second direction crossing the first direction with the bending area between the first non-bending area and the second non-bending area;
   an outer member over a first surface of the display panel; and
   a stress control member between the display panel and the outer member and comprising a first surface contacting the outer member and a second surface opposite to the first surface of the stress control member,
   wherein, in a non-bending state, the first surface of the stress control member is a flat surface and the second surface is a curved surface.

15. The flexible display device of claim 14, wherein the stress control member comprises:
   a first control area overlapping with the bending area and a second control area and a third control area overlapping with the first non-bending area and the second non-bending area, respectively, such that the first control area is between the second control area and the third control area, and
   wherein a maximum thickness of the first control area is less than a thickness of an end of the second control area spaced apart from the first control area in the second direction and a thickness of an end of the third control area spaced apart from the first control area in the second direction.

16. The flexible display device of claim 15, wherein the stress control member has a thickness which gradually increases as the stress control member is farther away from the bending axis in the second direction.

17. The flexible display device of claim 15, wherein the first control area has a uniform thickness.

18. The flexible display device of claim 15, wherein a portion which overlaps with the bending axis in the first direction, of the first control area, is defined as a central portion,
   wherein the central portion has a thickness in a range of 50 μm or more to 150 μm or less, and
   wherein the end of each of the second control area and the third control area has a thickness in a range of 150 μm or more to 300 μm or less.

19. The flexible display device of claim 14, wherein the display panel comprises an opposite surface that is opposite to the first surface of the display panel,
   wherein the second surface contacts the opposite surface, and
   wherein the opposite surface has a shape corresponding to the second surface.

20. The flexible display device of claim 14, wherein the stress control member comprises a pressure sensitive adhesive.

* * * * *